United States Patent [19]

Nakamura et al.

[11] Patent Number: 5,288,329
[45] Date of Patent: Feb. 22, 1994

[54] CHEMICAL VAPOR DEPOSITION APPARATUS OF IN-LINE TYPE

[75] Inventors: Kyuzo Nakamura; Michio Ishikawa; Kazuyuki Ito; Noriaki Tani; Masanori Hashimoto; Yoshifumi Ota, all of Chiba, Japan

[73] Assignee: Nihon Shinku Gijutsu Kabushiki Kaisha, Japan

[21] Appl. No.: 616,106

[22] Filed: Nov. 20, 1990

[30] Foreign Application Priority Data

Nov. 24, 1989 [JP] Japan .................................. 303063

[51] Int. Cl.⁵ ............................................ H01L 21/00
[52] U.S. Cl. ................................. 118/729; 118/715; 118/722; 118/719; 118/723 I; 156/345
[58] Field of Search ................. 156/345; 118/722, 723, 118/719, 729, 715

[56] References Cited

U.S. PATENT DOCUMENTS

| 4,618,477 | 10/1986 | Babu et al. | 204/298.34 |
| 4,709,655 | 12/1987 | Van Mastrigt | 118/728 |
| 4,816,113 | 3/1989 | Yamazaki | 118/728 |
| 4,824,545 | 4/1989 | Arnold et al. | 118/719 |
| 4,857,139 | 8/1989 | Tashiro et al. | 156/345 |
| 4,895,107 | 1/1990 | Yano et al. | 118/719 |

FOREIGN PATENT DOCUMENTS

| 61-189648 | 8/1986 | Japan . |
| 62-057213 | 3/1987 | Japan . |
| 63-161636 | 7/1988 | Japan . |

Primary Examiner—Brian E. Hearn
Assistant Examiner—George A. Goudreau
Attorney, Agent, or Firm—Larson and Taylor

[57] ABSTRACT

An in-line type chemical vapor deposition apparatus having an etching device for cleaning at least substrate holders, which is provided downstream of the substrate unloading station in which the processed substrates are removed from the substrate holders at atmosphere pressure. The etching device comprises a plasma etching means in which the substrate holders are positioned on an anode side or a dry-etching means in which the substrate holders are positioned on a cathode side, thereby reducing the down time of the apparatus without any influence of an exfoliation of an adhered film from the substrate holders or other portions.

8 Claims, 4 Drawing Sheets

CHEMICAL VAPOR DEPOSITION APPARATUS OF IN-LINE TYPE

BACKGROUND OF THE INVENTION

The present invention relates to an in-line type chemical vapor deposition (CVD) apparatus which may be used for producing a thin film transistor(TFT) for a liquid crystal display, or an amorphous Si:H film and SiNx film for a solar battery for example.

It is known that the production of the thin film transistor(TFT) for the liquid crystal display, or the amorphous Si:H film and SiNx film for the solar battery is performed by using a plasma chemical vapor deposition process. Generally, an in-line type plasma chemical vapor deposition apparatus is used as a mass-production system for producing such components. In the conventional in-line type plasma chemical vapor deposition apparatus, a substrate is mounted on a substrate holder under an atmosphere, the substrate holder with the substrate to be processed is introduced into a preparation chamber which in turn is evacuated, and transported into a plasma CVD process chamber in which a thin film is formed on the substrate by the chemical vapor deposition. Then, the holder of the substrate having the thin film formed thereon is carried into a chamber which in turn is vented, and is transported to a taking-out or withdrawing station from which the processed substrate is taken out.

As a practical system there are proposed a vertical type CVD apparatus in which the substrate holder is vertically disposed, a vertical double side type CVD apparatus in which the substrate holder is vertically and movably disposed on the both sides thereof, and a horizontal type apparatus in which the substrate holder is horizontally and movably disposed.

In any one of such conventional apparatuses, at first the substrate to be processed is mounted on the substrate holder which in turn is carried into the preparatory chamber. This preparatory chamber is evacuated by a vacuum pump up to $10^{-3} \sim 10^{-5}$ Torr. After evacuation of the preparatory chamber, the substrate holder with the substrate is moved into CVD processing chamber. As the case may be, the substrate mounted on the holder may be heated approximately to 200° C.~300° C. in the preparatory chamber. Into the CVD processing chamber is introduced a gas such as $SiH_4$, $NH_3$, $N_2$ or the like so that a-Si:H film or SiNx film is formed on the substrate. With the plasma CVD process, there is provided a RF cathode electrode opposite to the substrate in the CVD processing chamber. This cathode electrode is supplied with RF voltage for generating a grow discharge to cause the introduced gas to be disolved and to deposit a-Si:H film or SiNx film on the substrate. With the application of a heat assisted CVD or an optical CVD, which will be materialized in the future, the RF cathode is replaced by a heater or a light source for generating a heat or light energy by which the introduced gas is disolved so as to deposit a-Si:H film or SiNx film, or polycrystal Si film or $SiO_2$ on the substrate.

It is also known to provide a CVD processing chamber having a plurality of chamber sections. For example, if two-layer film consisting of a-Si:H film and SiNx films is to be formed on the substrate, two CVD processing chamber sections may be connected to each other, or there may be provided a separation chamber between the CVD processing chamber sections so that the gases introduced into the respective chamber sections are not mixed.

After the forming of the desired thin film is completed, the substrate holder is transported into the unloading chamber which in turn is vented. Then the substrate holder thus exposed to an atmosphere is returned to the substrate mounting station where a new substrate to be processed is mounted on the returned substrate holder. In this way the above mentioned procedures may be repeated and a plurality of substrate holders may be sequentially moved through the whole system.

With the above mentioned conventional in-line type CVD apparatuses, since the same substrate holder is sequentially and repeatedly used, there is a tendency to deposit a-Si:H film or SiNx film on the holder portion as well as the substrate. In particular, in case of the CVD apparatus for producing the TFT, SiNx film has a thickness of about 5000Å to 10000Å and thus the film to be deposited on the holder portion becomes very thick. Also, the SiNx film has a larger inner stress which causes to peel it off very easily. Consequently, the film deposited on the holder portion may be peeled off easily, which leads to cause any defect on the substrate.

In order to avoid this disadvantage in the conventional apparatuses, as soon as the peeling-off of the undesirably deposited film occurs it is necessary to stop the operation of the system and to clean the inner portion thereof. Therefore, the conventional system has a very low working ratio and a bad yield in the products.

Also, the conventional in-line type CVD apparatuses have another disadvantage that there is an undesirable film deposition on the surface of the cathode and any defect may be formed on the substrate by the peeling-off of the deposited film from the cathode electrode. Since the cathode is in general fixed in the vacuum chamber, the cleaning thereof must be performed by releasing the vacuum chamber from the vacuum condition. As a result, some reduction of the working ratio of the system can not be avoided.

Generally, the films deposited on the substrate holder and the cathode electrode may be removed by a dry-etching which consists of introducing $CF_4$ or $SF_6$ into the CVD processing chamber and applying RF voltage to the cathode electrode. However, it is necessary to stop the system for a very long period in order to remove the films deposited on the substrate holder and the cathode with taking time.

SUMMARY OF THE INVENTION

It is therefore an object of the present invention to overcome the disadvantages involved in the conventional system and to provide an in-line type CVD apparatus capable of removing the undesired films deposited on the substrate holder or other components without stop of the operation for a long period.

According to the present invention, there is provided an in-line type CVD apparatus comprising a substrate loading chamber in which a substrate to be processed is mounted on a substrate holder under an atmosphere pressure, a preparatory chamber being evacuated in which the substrate is pretreated, a processing chamber in which a desired film is formed on the substrate, a substrate withdrawing chamber, a substrate unloading chamber in which the processed substrate is dismounted from the substrate holder, an etching chamber provided subsequent to the substrate unloading chamber for etching at least the substrate holder without the processed substrate in a vacuum condition, the substrate unloading chamber being connected to the substrate loading chamber via the etching chamber, a plurality of gate valves each of which is provided between the adjacent chambers, and means for transporting at least the substrate holder sequentially through the respective chambers.

In case the present invention is applied to a plasma CVD apparatus, preferably, the cathode member can be transported together with the substrate holder, and the cathode member and the substrate holder can be dry-etched simultaneously or separately.

The etching process chamber in the apparatus of the present invention comprises a plasma etching means in which the portions to be etched are arranged on an anode side, or a dry-etching process means such as RIE process in which the portions to be etched are arranged on a cathode side.

When the apparatus of the present invention is to be carried out as the plasma CVD apparatus, the etching process section may be constructed so that the surface plate of each cathode member is supplied with RF voltage and the etching process is performed by using each substrate holder as an anode electrode in the same way as the plasma CVD.

The etching process comprises three steps, that is a vacuum evacuating step, an etching step while introducing a gas into the etching process chamber and a vent step. These steps may be carried out in the same chamber or different chambers.

The present invention will now be described by way of example with reference to the accompanying drawings.

DETAILED DESCRIPTION

Figure 1:
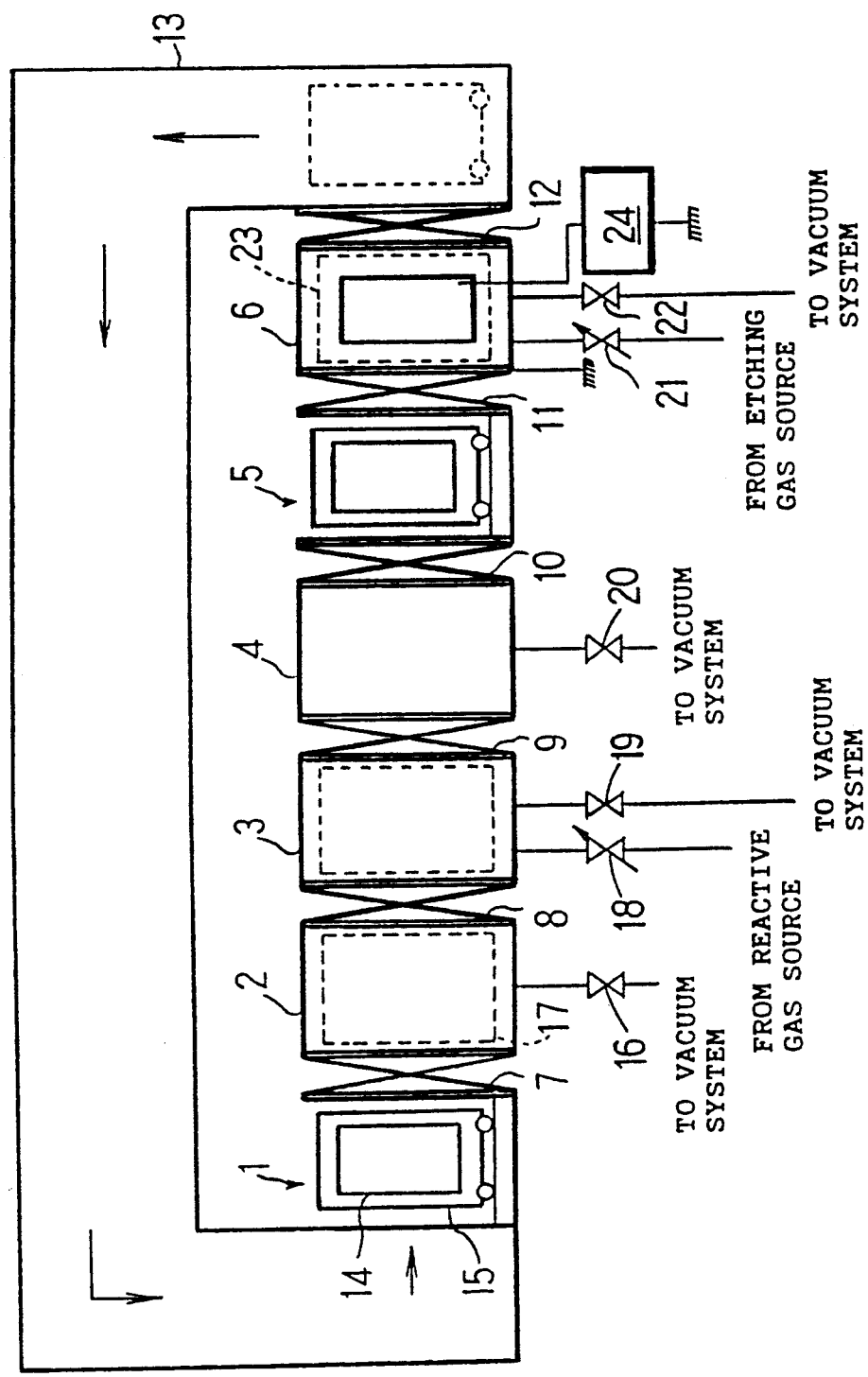
FIG. 1 is a view schematically showing one embodiment of the present invention.

With reference to FIG. 1 there is shown the arrangement of an in-line type CVD apparatus according to one embodiment of the present invention using a thermal CVD. The illustrated apparatus comprises a substrate loading station or chamber 1, a preparatory station or chamber 2, a processing or film forming station or chamber 3, substrate taking-out or withdrawing station or chamber 4, a substrate unloading station 5 and an etching station or chamber 6. The adjacent ones of the respective stations are separated by gate valves 7, 8, 9, 10 and 11, respectively. The etching station 6 has an outlet opening which is connected through a gate valve 12 to one end of a return conveyor 13. To the other end of the return conveyor 13 is directly connected the inlet opening of the substrate loading station 1.

The loading station 1 is arranged so that a substrate 14 to be processed is mounted on a movable substrate holder 15 under an atmosphere.

The preparatory station 2 is connected via a valve 16 to a vacuum system not shown for vacuum evacuating therein. In this preparatory station 2 there may be provided a heater 17 as shown in a dotted line, and thus the preparatory station 2 may be used as a heating chamber. In that case, the substrate 14 may be heated to a desired temperature while evacuating the preparatory station 2.

The film forming station 3 is connected via a variable flow valve 18 to a source for supplying a reactive gas such as $SiH_4$, $NH_3$ or the like. Also, to the film forming station 3 is connected a vacuum pump not shown through a valve 19. By introducing a desired reactive gas from the reactive gas source into the film forming station 3 via the variable flow valve 18, a desired film is formed on the substrate 14.

The substrate taking-out station 4 is connected via a valve 20 to a vacuum system, and is arranged so as to take out the substrate holder 15 with the film formed substrate 14 from the film forming station 3 without releasing the vacuum condition.

The substrate unloading station 5 is constructed to receive the substrate holder 15 with the processed substrate 14 from the substrate taking-out station 4, dismount the processed substrate 14 from the substrate holder 15, and transfer only the substrate holder 15 into the etching station 6.

The etching station 6 is on one hand connected via a variable flow valve 21 to a gas supply not shown for an etching gas such as $CF_4$, and on the other hand is connected via a valve 22 to a vacuum system not shown. Also, in the etching station 6 there is provided an RF cathode electrode 23 which is electrially connected to an outer RF power source 24. The RF cathode electrode 23 is provided with an $SiO_2$ plate on the surface thereof.

Figure 2:
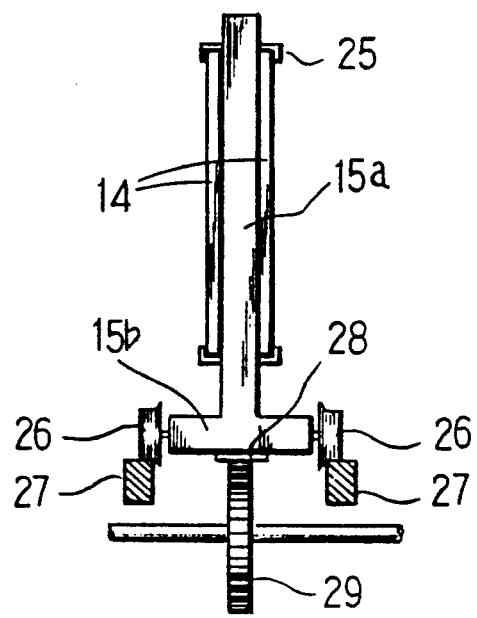
FIG. 2 is a sectional view showing an example of a substrate holder carrying mechanism which may be used in the apparatus of FIG. 1.
Figure 3:
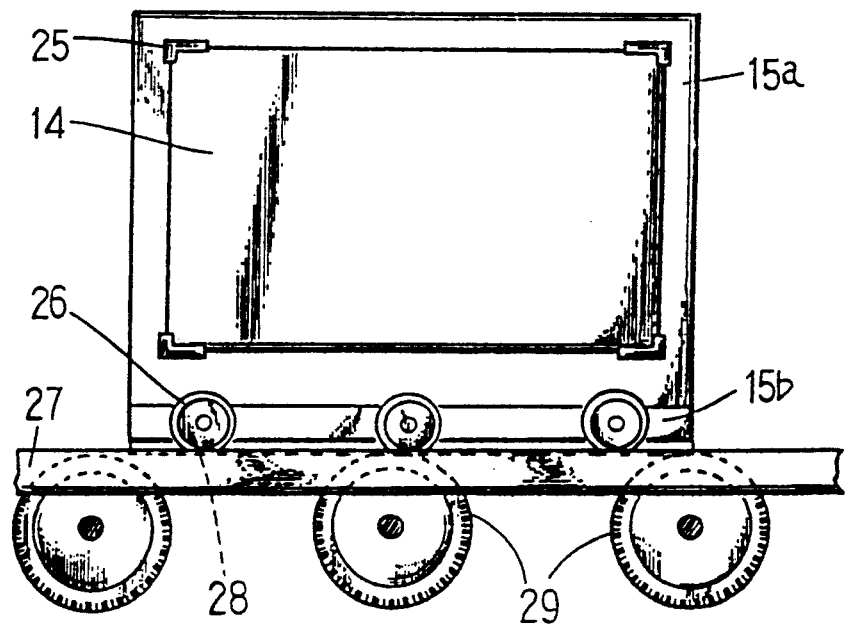
FIG. 3 is a side view of the substrate holder carrying mechanism of FIG. 2.

FIGS. 2 and 3 show an example of a driving mechanism for the substrate holder 15 used in the apparatus shown in FIG. 1. The illustrated substrate holder is of a vertical type, on the both sides of which substrates are mounted. The substrate holder comprises a vertically extended holder body 15a on the both sides of which the substrates 14 are mounted by supporting pins 25. The holder body 15a has a base portion 15b on which rollers 26 are provided. Each roller 26 is rested and run on a rails 27. The rails 27 are not shown in FIG. 1, but are laid passing through the respective stations.

The base portion 15b of the holder body 15a is provided with a rack 28 on the under side thereof. The rack 28 is extended along the axial direction of the holder body 15a and is engaged with respective driving pinions three of which is designated by a reference numeral 29. The respective driving pinions are provided in the associated stations of FIG. 1. In response to the rotation of the respective driving pinions, therefore, the substrate holder can be moved along the rails 27.

In the operation of the thus constructed apparatus, at first, the substrates 14 to be processed are mounted on the both side surfaces of the substrate holder 15 by suitable mounting means in the substrate loading station 1. The substrate holder 15 with the substrates 14 mounted is transferred into the preparatory station 2 through the opened gate valve 7. After closing of the gate valve 7, the preparatory station 2 is evacuated by the evacuation system through the valve 16, and if desired the heater 17 may be activated to heat the substrates 14 during the evacuation. In this way, when the predetermined vacuum condition and/or temperature are attained in the preparatory station 2, the gate valve 8 is opened and the substrate holder 15 is transferred into the film forming station 3 previously evacuated through the opened gate valve 8.

By opening the variable flow valve 18 there is introduced the reactive gas such as SiH4, NH3 or the like from the reactive gas source into the film forming station 3. Consequently, the film forming on the respective substrates 14 is performed in accordance with a conventional heat assisted CVD process. When the film formation on the each substrate 14 is completed, the gate valve 9 positioned between the film forming station 3 and the substrate taking-out station 4 is opened, and the substrate holder 15 is transferred from the film forming station 3 into the substrate taking-out station 4 and is exposed to an atmosphere or vented. Then, by opening the gate valve 10, the vented substrate holder 15 is transferred into the substrate unloading station 5 in which each processed substrate 14 is dismounted from the substrate holder 15.

After dismounting of substrates 14, the emptied substrate holder 15 is transferred through the opened gate valve 11 into the etching station 6. The etching station 6 is evacuated up to the order of $10^{-3}$ Torr through the valve 22, and then the etching gas such as $CF_4$ is introduced into the etching station 6 through the variable flow valve 21 so that the pressure in the inner space of the etching station 6 becomes 0.5 Torr. To the RF cathode electrode 23 is applied RF power of 13.56 MHz from the external RF power source 24. The transferred substrate holder 15 behaves as an earth electrode and a plasma etching is carried out so as to remove the film, for example, a-Si film or a-SiN film deposited on the substrate holder 15. After removing of the film on the substrate holder 15, the introduction of the etching gas is stopped. In order to remove a very small amount of C or any polymer material produced in the etching, $H_2$ gas is introduced into the etching station 6 so that it has a pressure 0.5 Torr. Then, the applied RF power is switched off and the inner space of the etching station 6 is vented to an atmosphere. The thus cleaned substrate holder 15 is fed through the opened gate valve 12 to the return conveyor 13. The return conveyer 13 carries the cleaned substrate holder 15 into the substrate loading station 1 for subsequent preparation.

Figure 4:
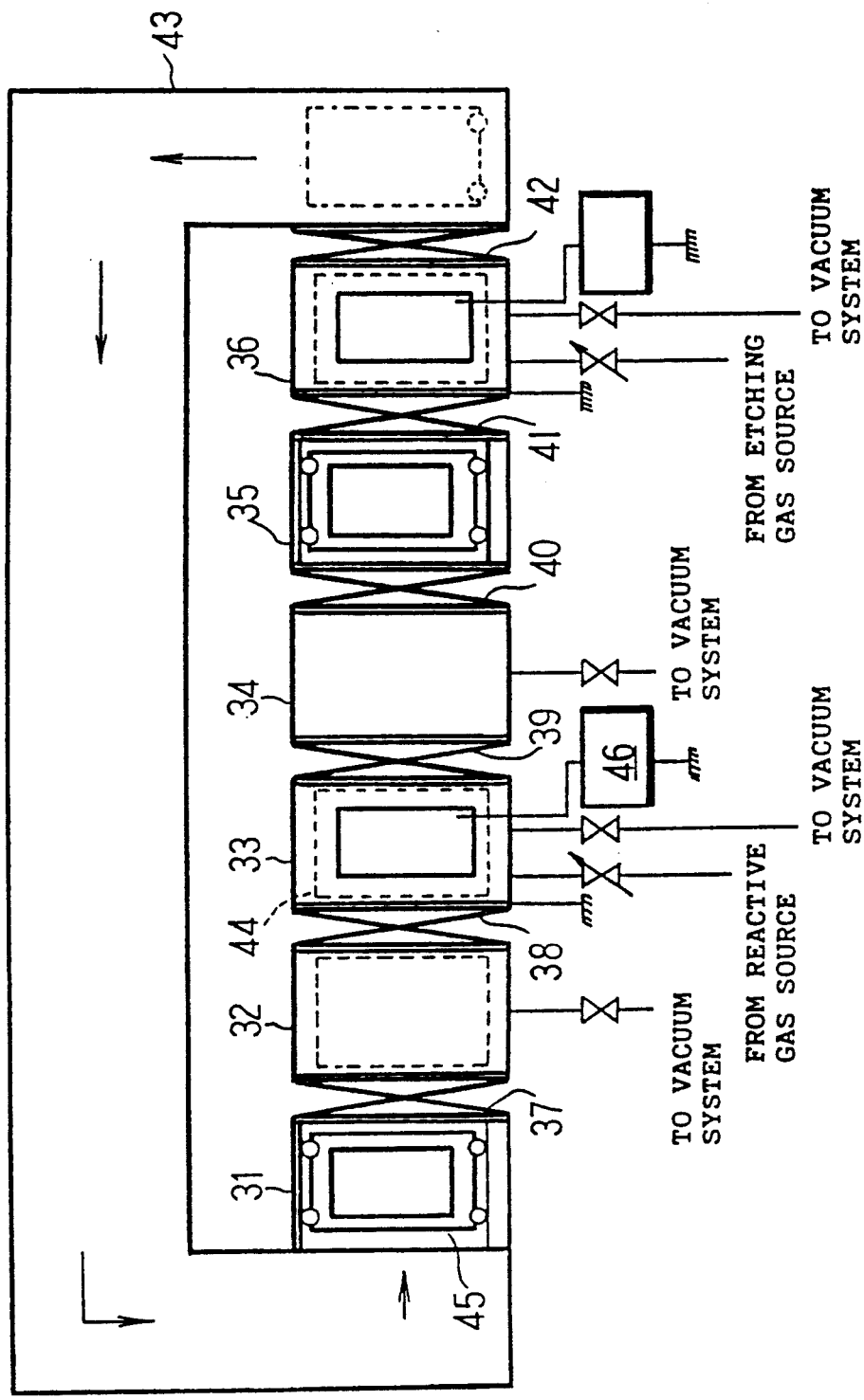
FIG. 4 is a view schematically showing another embodiment of the present invention.

Referring to FIG. 4, there is shown another embodiment of the present invention using a plasma CVD. In FIG. 4, reference numeral 31 denotes a substrate loading station, 32 denotes a preparatory station, 33 denotes a processing or film forming station, 34 denotes a substrate taking-out station, 35 designates a substrate unloading station and 36 designates an etching station. The adjacent ones of the respective stations are separated by gate valves 37, 38, 39, 40 and 41, respectively.

Similar to the embodiment of FIG. 1, the etching station 36 has an outlet opening which is connected through a gate valve 42 to one end of a return conveyor 43. To the other end of the return conveyor 43 is directly connected the inlet opening of the substrate loading station 31. Excepting the film forming station 33 the stations have similar construction to that of the arrangement of FIG. 1.

The film forming station 33 is provided with RF cathode electrode plates 44 which are vertically disposed and may be moved together with a substrate holder 45 or independent thereon. Each electrode plate 44 is connected to an external RF power source 46.

Figure 5:
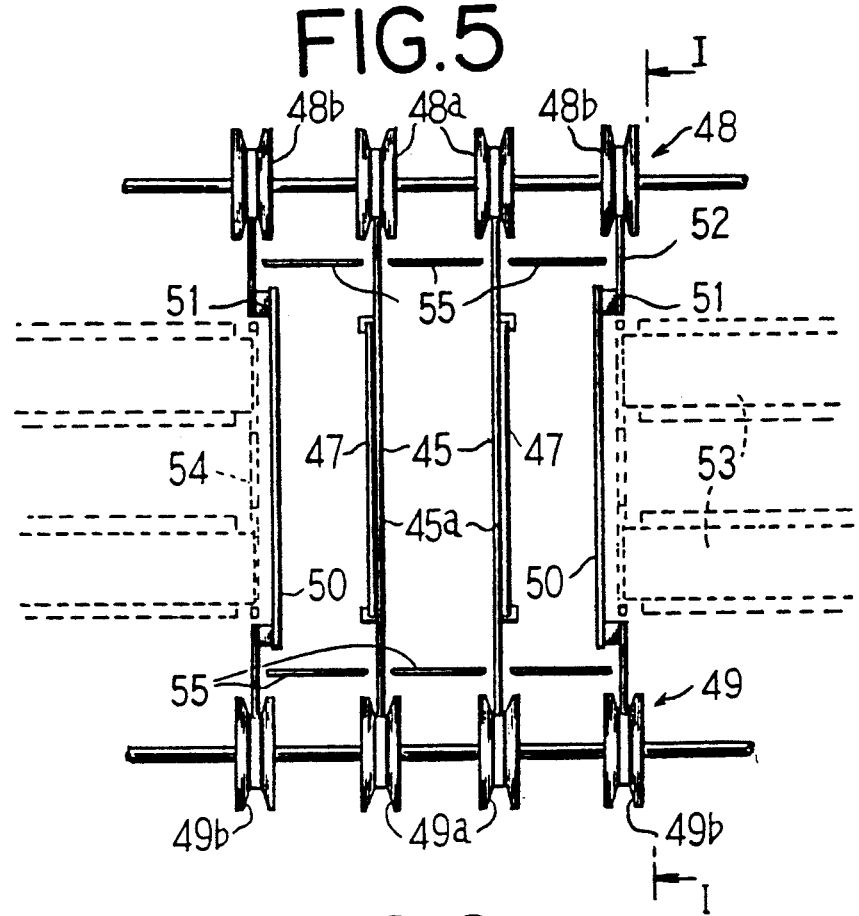
FIG. 5 is a sectional view showing an example of a carrying mechanism for substrate holders and cathode plates which may be used in the apparatus of FIG. 4.
Figure 6:
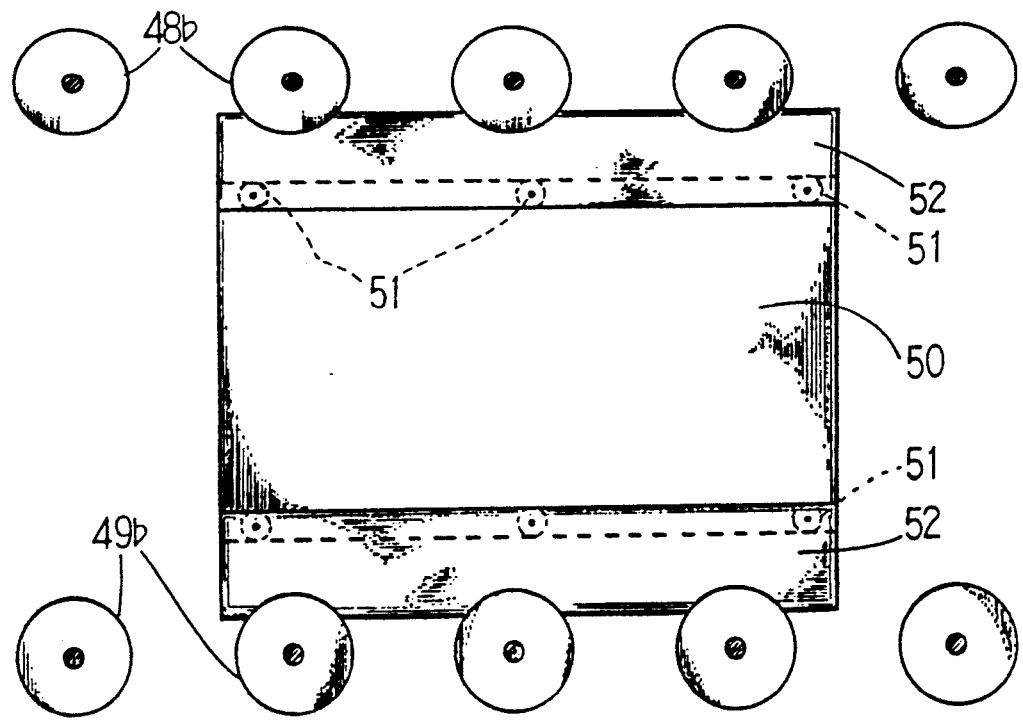
FIG. 6 is a schematic view taken on the line I—I of FIG. 5.

An example of the substrate holder 45 is illustrated in FIGS. 5 and 6 in which the substrate holder 45 comprises two substrate holder bodies 45a. Each holder body 45 supports a substrate 47 on one side or outer surface thereof, and is vertically supported and moved by rollers 48a and 49a of upper and lower carrying roller trains 48 and 49. Opposite to the outer surface of each holder body 45 there are disposed RF cathode electrode plates 50 each of which is attached via insulator members 51 to a supporting frame 52. Each supporting frame 52 is vertically supported and moved by rollers 48b and 49b of the upper and lower carrying roller trains 48 and 49. Thus, in this embodiment the RF cathode electrode plates 50 as well as the holder bodies 45a can be moved by means of the upper and lower carrying roller trains 48 and 49.

As shown by dotted lines in FIG. 5, the film forming station 33 and the etching station 36 may be provided with RF power supply electrodes 53 each of which is transversely displaceable. Consequently, each RF power supply electrode 53 is moved to come into contact with the associated RF cathode plate 50 when the latter is positioned opposite thereto, and is moved in a direction away from the associated RF cathode plate 50 when it is transferred together with the substrate holder 45. In FIG. 5, also, reference numerals 54 and 55 designate earth shields for protecting the back surfaces of each RF cathode plate 50 and each substrate holder body 45a from any deposition of reaction products.

In the embodiment shown in FIGS. 4 and 5, since each substrate holder 45a and each RF cathode plate 50 can be transported simultaneously, they can be etched and cleaned for every operation cycle.

It should be understood that the transporting mechanism of each substrate holder and each RF electrode plate is not limited to the illustrated ones in FIGS. 2, 3, 5 and 6, and thus it may be replaced by any other mechanism known in the art. It is, also, possible to use any other type substrate holder instead of the illustrated ones.

In the illustrated embodiments, the plasma CVD processing and etching are carried out by using double-pole RF discharge. However, the present invention may be adapted to any one of plasma systems such as a magnetron discharge, Penning discharge, ECR discharge or the like.

Further, each of the illustrated etching stations comprises one chamber which is able to perform an evacuating, an etching and a venting. If necessary, however, the etching station may comprise three chambers separated from each other, that is a preparatory chamber, an etching chamber and a taking-out chamber.

Furthermore, it should be appropriated that in the illustrated embodiments of FIGS. 2, 3, 5 and 6, each RF cathode plate and the substrate holder may be constructed to be transported independently. In that case, the etching of the substrate holder and each RF electrode plate may be performed separately.

As described above, since the in-line type CVD apparatus according to the present invention is provided with the etching station for cleaning the substrate holders and the electrode members rearward the substrate unloading station in which the processed substrates are removed from the substrate holders in an atmoshere, the present invention has an advantage that it is possible to reduce the occurrence of any defect on the substrates due to an exfoliation of the film adhered to the substrate holders or the other portion, and consequently to extend the period from a previous cleaning operation to the next one, that is to reduce the down time of the system, thereby greatly increasing the working ratio of the CVD apparatus.

Further, in case the present invention is to be carried out as a plasma CVD apparatus, it is possible to clean the cathode electrode plates as well as the substrate holders by arranging the former to be movable. Therefore, the present invention has also an advantage that the probability of an exfoliation of the adhered film can be more reduced.

It is to be understood that the present invention is not limited to the particular embodiments described and illustrated and that numerous modifications and alterations may be made by those skilled in the art without departing from the spirit and scope of the invention.

We claim:

1. An in-line type CVD apparatus comprising a substrate loading chamber in which a substrate to be treated is mounted on a substrate holder under an atmosphere pressure, a preparatory chamber being evacuated in which the substrate is pre-treated, a processing chamber in which a desired film is formed on the substrate, a substrate withdrawing chamber, a substrate unloading chamber in which the processed substrate is dismounted from the substrate holder, an etching chamber provided subsequent to the substrate unloading chamber for etching at least the substrate holder without the processed substrate in a vacuum condition, said etching chamber being provided with an RF cathode member which is movable together with said substrate holder, the substrate unloading chamber being connected to the substrate loading chamber via the etching chamber, a plurality of gate valves each of which is provided between the adjacent chamber, and means for transporting at least the substrate holder sequentially through the respective chambers.

2. An apparatus according to claim 1, wherein said transporting means comprises a plurality of upper and lower roller trains provided in each chamber.

3. An apparatus according to claim 1, wherein said each upper and lower roller train supports vertically the substrate holder and the RF cathode member.

4. An in-line type CVD apparatus comprising:
a substrate loading chamber in which a substrate to be treated is mounted on a substrate holder under atmospheric pressure;
a preparatory chamber connected to said substrate loading chamber and being evacuated in which the substrate is pre-treated;
a processing chamber being connected to said preparatory chamber in which a desired film is formed on the substrate;
a substrate withdrawing chamber connected to said processing chamber;
a substrate unloading chamber connected to said substrate withdrawing chamber in which the processed substrate is dismounted from the substrate holder;
an etching chamber provided subsequent to the substrate unloading chamber for etching at least the substrate holder without the processed substrate under vacuum, said etching chamber being provided with an RF cathode member;
means for carrying the etching substrate holder from said etching chamber to said substrate loading chamber;
a plurality of gate valves each of which is provided between the adjacent chambers;
the respective chambers being in-line arranged for forming a closed loop system; and
means for transporting at least the substrate holder sequentially through the respective chambers, and including a plurality of upper and lower roller trains provided in each chamber.

5. An apparatus according to claim 1, wherein said upper and lower roller train supports vertically the substrate holder and the RF cathode member.

6. An apparatus according to claim 4, wherein said etching chamber is arranged to perform plasma etching in which the substrate holder to be etched behaves as an anode.

7. An apparatus according to claim 4, wherein said etching chamber is arranged to perform a dry-etching of the RF cathode member and the substrate holder.

8. An apparatus according to claim 4, wherein said etching chamber is provided with means for applying RF voltage to said RF cathode member.

* * * * *